United States Patent
Kaida

(10) Patent No.: US 7,483,461 B2
(45) Date of Patent: Jan. 27, 2009

(54) SEMICONDUCTOR LASER DIODE WITH A PLURALITY OF OPTICAL GUIDING LAYERS

(75) Inventor: Noriaki Kaida, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 4 days.

(21) Appl. No.: 11/790,686

(22) Filed: Apr. 26, 2007

(65) Prior Publication Data

US 2007/0258497 A1 Nov. 8, 2007

(30) Foreign Application Priority Data

Apr. 28, 2006 (JP) .............................. 2006-125940

(51) Int. Cl.
*H01S 5/00* (2006.01)

(52) U.S. Cl. .................... 372/43.01; 372/45.01

(58) Field of Classification Search ............. 372/43.01, 372/45.01
See application file for complete search history.

(56) References Cited

U.S. PATENT DOCUMENTS

| 5,923,688 | A | | 7/1999 | Nakamura |
| RE36,431 | E | * | 12/1999 | Muro et al. ............. 372/45.01 |
| 6,606,334 | B1 | * | 8/2003 | Shigihara et al. ......... 372/45.01 |
| 2002/0105992 | A1 | * | 8/2002 | Arakawa et al. ............ 372/50 |
| 2004/0051107 | A1 | * | 3/2004 | Nagahama et al. ........... 257/79 |
| 2004/0061119 | A1 | * | 4/2004 | Inoue et al. .................. 257/79 |
| 2005/0127391 | A1 | * | 6/2005 | Yanamoto ................. 257/103 |
| 2005/0148107 | A1 | * | 7/2005 | Byun et al. ................... 438/31 |
| 2006/0098703 | A1 | * | 5/2006 | Kuramoto ............... 372/43.01 |
| 2006/0127391 | A1 | * | 6/2006 | Scarisbrick et al. ...... 424/133.1 |
| 2006/0187995 | A1 | * | 8/2006 | Peters et al. .................. 372/96 |
| 2006/0219996 | A1 | * | 10/2006 | Yamamoto et al. ........... 257/12 |

FOREIGN PATENT DOCUMENTS

| JP | 4-369285 | 12/1992 |
| JP | 7-154023 | 6/1995 |
| JP | 9-199791 | 7/1997 |
| JP | 2004-172382 | 6/2004 |
| JP | 2005-167137 | 6/2005 |
| JP | 2006-49622 | 2/2006 |
| WO | 2004/112208 | 12/2004 |

OTHER PUBLICATIONS

Notification of Reasons of Rejection.

* cited by examiner

*Primary Examiner*—Minsun Harvey
*Assistant Examiner*—Phillip Nguyen
(74) *Attorney, Agent, or Firm*—Smith, Gambrell & Russell, LLP

(57) ABSTRACT

The present application provides a laser diode that enables to reduce the differential resistance. The laser diode of the invention provides first and second guiding layer in an n-side of an active layer. The first guiding layer is put between the active layer and the n-type cladding layer; while, the second guiding layer is put between the first cladding layer and the active layer. These first and second guiding layers are intrinsic layers or p-type layers, where the conduction band level of the second guiding layer is lower than that of the first guiding layer, while the band gap wavelength of the first guiding layer is shorter than that of the second guiding layer.

10 Claims, 5 Drawing Sheets

SEMICONDUCTOR LASER DIODE WITH A PLURALITY OF OPTICAL GUIDING LAYERS

BACKGROUND OF THE INVENTION

1. Field of the Invention

The present invention relates to a semiconductor laser diode, in particular, a laser diode providing a plurality of optical guiding layers in a side of an n-type cladding layer.

2. Related Prior Art

A United States Patent, U.S. Pat. No. 5,923,688, has disclosed a semiconductor laser diode (hereinafter denoted as LD) that includes an active layer, and a pair of separate confinement hetero-structure (SCH) layers sandwiching the active layer therebetween. The SCH layers, configured with a multiple layers more than two layers, have a band gap energy gradually increasing as a part from the active layer. Such SCH layers suppress an inner loss due to the increase of the carriers within the active layer and degradation of the quantum efficiency due to the overflowing of the carriers from the active layer. Thus, the LD disclosed in the '688 patent enables to operate in higher ambient temperatures with substantially superior efficiency.

A conventional LD generally provides a graded index structure, which is often called as GRIN structure, and a stepped-FRIN structure to effectively confine light and electrons in the active layer and layers adjacent to the active layers. The stepped-GRIN structure includes a plurality of guiding layers to enhance the optical confinement efficiency, where layers closer to the active layer have a composition to show the higher refractive index, which is equivalent to a configuration where the band gap energy of each guiding layers becomes smaller as the layer approaches the active layer. Especially, a type of conventional LD that provides an active layer including AlGaInAs or AlInAs often provides the first guiding layer, which is apart from the active layer, with a band gap wavelength shorter than 1.1 μm. However, such guiding layers, put between the active layer and the cladding layer, are generally doped to lower the differential resistance of the device.

SUMMARY OF THE INVENTION

Thus, a feature of the present invention is, in an LD with the first guiding layer, which is apart from the active layer, including AlGaInAs, to provide a configuration to suppress the band bending appeared at an interface between the second guiding layer closes to the active layer and the active layer, which reduces differential resistance of the device without degrading the optical confinement characteristic within the active layer.

A laser diode (LD) according to the present invention has a feature that the LD includes an active layer, an n-type cladding layer, and first and second guiding layers. The first guiding layer is provided between the n-type cladding layer and the active layer, while, the second guiding layer is provided between the first guiding layer and the active layer. The first guiding layer is an un-doped AlGaInAs layer with a carrier concentration smaller than $1 \times 10^{11}$ cm$^{-3}$. The band gap wavelength of the first guiding layer may be shorter than the band gap wavelength of the second guiding layer.

According to the present layer configuration of the LD, the differential resistance of the LD may be reduced because the band bending within the second guiding layer may be suppressed due to the un-doped first guiding layer, while, the carrier confinement in the active layer may be kept by the first and second guiding layers.

The first guiding layer may be a p-type AlGaInAs layer with a hole concentration greater than $1 \times 10^{16}$ cm$^{-3}$ and smaller than $1 \times 10^{18}$ cm$^{-3}$, which makes the series resistance of the device compatible with the effective carrier confinement within the active layer, because the band bending within the second guiding layer may be suppressed by the p-type first guiding layer.

In the present invention, the second guiding layer may be made selected from a group of AlGaInAs, a composition of which is different from that of the first guiding layer, or GaInAsP, where the level of the bottom of the conduction band in the first guiding layer may be raised with respect to adjacent layers to effectively confine carries within the active layer. The thickness of the first guiding layer is preferably greater than 30 nm, while, the thickness of the second guiding layer is preferably greater than a thickness of the barrier layer when the active layer has a multiple quantum well structure with a plurality of barrier layers and a plurality of well layers, or preferably greater than 20 nm.

DESCRIPTION OF PREFERRED EMBODIMENTS

Next, preferred embodiments of the present invention will be described as referring to accompanying drawings. The same numerals or symbols will refer to the same elements without overlapping explanations.

First Embodiment

Figure 1:
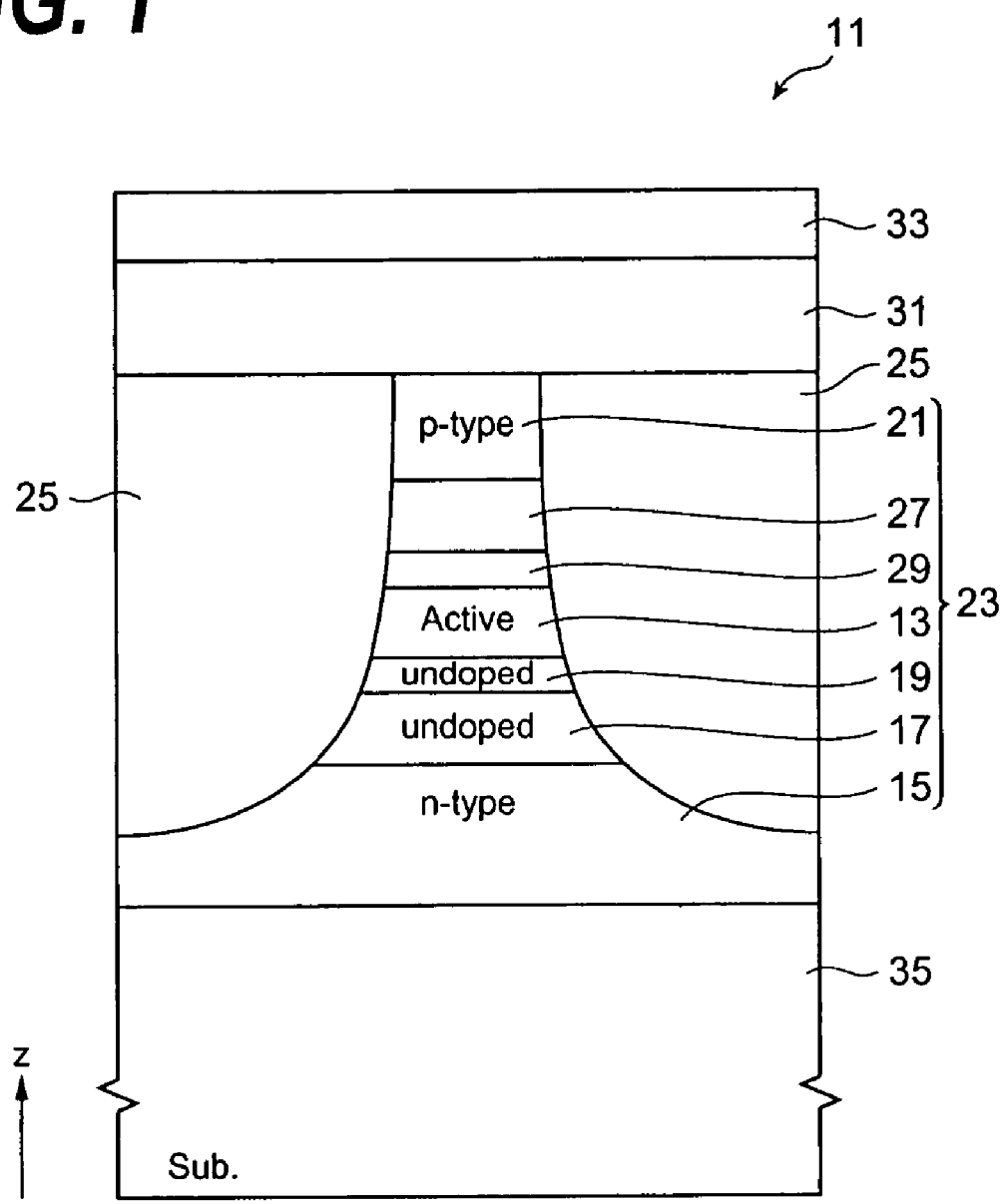
FIG. 1 is a cross section of a laser diode according to a first embodiment of the invention.

FIG. 1 is a schematic view showing a laser diode (LD) according to an embodiment of the invention. The LD 11 includes an active layer 13, an n-type cladding layer 15, a first guiding layer 17, and a second guiding layer 19. The n-type cladding layer 15 is made of a first group III-V compound semiconductor material. The first guiding layer 17, arranged between the n-type cladding layer 15 and the active layer 13, is made of second III-V compound semiconductor material. The second guiding layer 19, arranged between the first guiding layer 17 and the active layer 13, is made of third group III-V compound semiconductor material. The first guiding layer 17 is configured to be an un-doped layer. The level of the conduction band in the second guiding layer 19 is lowered to the level of the conduction band in the first guiding layer 17. Further, the band gap wavelength of the second semiconductor material in the first guiding layer 17 is shorter than the band gap wavelength of the third semiconductor material in the second guiding layer 19, where the band gap wavelength corresponds to a peak wavelength of the photo luminescence from the material.

The LD 11 in the first guiding layer 17 thereof is un-doped with no intentionally doped donors. Accordingly, even when the emission of the thermal electron causes an electron depletion layer therein, a electric field due to the positive ions in the first guiding layer 17 may be relaxed, which lowers the barrier height for the electron induced in the conduction band at the interface between the second guiding layer 19 and the active layer 13, and enhances the emission efficiency of the device when the second guiding layer 19 is un-doped layer.

The thickness of the first guiding layer 17 may be greater than 30 nm to obtain an effective optical confinement characteristic necessary to the operation of the device at high temperatures. The thickness of the second guiding layer 19 may be greater than 8 nm, which is equal to the thickness of the barrier layer in the multiple quantum well (MQW) structure. The second guiding layer 19 is further preferable to be thicker than 20 nm to further enhance the optical confinement to operate the device in further high temperatures.

The active layer 13 may be made of group III-V compound semiconductor material with a composition whose peak wavelength of the photo luminescence (PL) is within the 1.3 μm band. The active layer 13 may also provide the MQW structure whose PL wavelength is within the 1.3 μm band, or may include a MQW structure with 10 barrier layers each having a thickness of 10 nm and the PL wavelength within 1.0 μm band and 10 well layers each having a thickness of 5 nm with a composition so as to show the emission wavelength from the device within 1.3 μm band.

The LD 11 includes a p-type cladding layer 21 in addition to the n-type cladding layer 15. These cladding layers, 15 and 21, confines light generated in the active layer 13 between the cladding layers, 15 and 21. The band gap energy of these layers, 15 and 21, are greater than that of the active layer 13.

The LD 11 may further includes, between the active layer 13 and the p-type cladding layer 21, a plurality of guiding layers. The embodiment shown in FIG. 1 includes the third and fourth guiding layers, 27 and 29, respectively. The third guiding layer 27, which is put between the p-type cladding layer 21 and the active layer 13, is made of the fourth group III-V compound semiconductor material. The fourth guiding layer 29, which is put between the third guiding layer 27 and the active layer 13, is made of the fifth group III-V compound semiconductor material. The third and fourth guiding layers are p-type layers and the band gap wavelength of the fourth material for the third guiding layer 27 is shorter than that of the fifth material for the fourth guiding layer 29. The a portion of the n-type cladding layer 15, the first and second guiding layers, 17 and 19, the active layer 13, the third and fourth guiding layers, 27 and 29, and the p-type cladding layer form a mesa structure The LD 11 further includes current blocking regions 25 to bury the mesa structure 23. The current blocking layer 25 concentrates carries into the mesa structure 23. The LD 11 further includes, on the current blocking layers 25 and the mesa structure 23, a second cladding layer 31 and a contact layer 33 provided on the second cladding layer 31. These layers of the cladding layers, 15, 21 and 13, from the first to fourth guiding layers, 15, 17, 27, and 29, the active layer 13, and the contact layer 33 are disposed on the substrate 35 that may be an n-type semiconductor substrate.

Practical materials and conditions thereof of the LD 11 according to the first embodiment are shown in the following table I below:

TABLE I

| Configurations of the LD according to the Invention | | |
|---|---|---|
| Substrate 35 | n-InP | [n]: 1.4 × 10$^{18}$ cm$^{-3}$<br>t: 100 μm |
| n-type cladding layer 15 | n-InP | [n]: 8.8 × 10$^{17}$ cm$^{-3}$<br>t: 550 nm |

TABLE I-continued

| Configurations of the LD according to the Invention | | |
|---|---|---|
| first guiding layer 17 | un-dope AlGaInAs | λ(Eg): 0.92 μm<br>[i]: <1 × 10$^{11}$ cm$^{-3}$<br>t: 40 nm |
| second guiding layer 19 | un-dope AlGaInAs | λ(Eg): 1.0 μm<br>[i]: <1 × 10$^{11}$ cm$^{-3}$<br>t: 32 nm |
| active layer 13 | MQW structure | |
| fourth guiding layer 29 | p-type AlGaInAs | λ(Eg): 1.0 μm<br>[p]: 5 × 10$^{17}$ cm$^{-3}$<br>t: 32 nm |
| third guiding layer 27 | p-type AlGaInAs | λ(Eg): 0.92 μm<br>[p]: 5 × 10$^{17}$ cm$^{-3}$<br>t: 40 nm |
| p-type cladding layer 21 | p-InP | [p]: 6.5 × 10$^{17}$ cm$^{-3}$<br>t: 440 nm |
| current blocking region 25 | Fe-dope InP | |
| second cladding layer 31 | p-type InP | [p]: 9 × 10$^{17}$ cm$^{-3}$<br>t: 1650 nm |
| contact layer 33 | p-type GaInAs | [p]: 1.5 × 10$^{19}$ cm$^{-3}$<br>t: 530 nm |

Where [n] and [p] denote the electron and the hole concentration, while [i] denotes the carrier concentration unable to specify whether the electron or the hole, t is a thickness of each layer, and λ(Eg) is a band gap wavelength of respective layers.

In the conventional configuration of layers, only the first and second guiding layers are different from the configurations of the first embodiment listed in Table I. The first and second guiding layers of the conventional device are as follows;

TABLE II

| First and Second guiding layers of the conventional configuration | | |
|---|---|---|
| first guiding layer 17 | n-AlGaInAs | λ(Eg): 0.92 μm<br>[n]: 1 × 10$^{17}$ cm$^{-3}$<br>t: 40 nm |
| second guiding layer 19 | n-AlGaInAs | λ(Eg): 1.0 μm<br>[n]: 1 × 10$^{17}$ cm$^{-3}$<br>t: 32 nm |

In the embodiment above, the first and second guiding layers, 17 and 19, have different configuration from the embodiment shown in Table I, that is, the first and second guiding layers, 17 and 19, are changed to n-type layers form intrinsic layers in the first embodiment.

In the LD 11 shown in Tables I and II provides the stepped-GRIN structure with the guiding layers, 15 and 17. The first guiding layer 17, which is apart from the active layer, in other words, closer to the n-type cladding layer 15, is made of AlGaInAs with a higher potential in the conduction band. While, the second guiding layer 19 closer to the active layer 13 is preferable to be made of material, which is also made of AlGaInAs but having a composition different from that of the first guiding layer 17 in Tables I and II. Accordingly, the conduction band of the first guiding layer 17 is higher than that of the second guiding layer 19 to form a barrier for the carrier transportation by the first guiding layer 17 between the n-type cladding layer 15 and the active layer 13.

Figure 2:
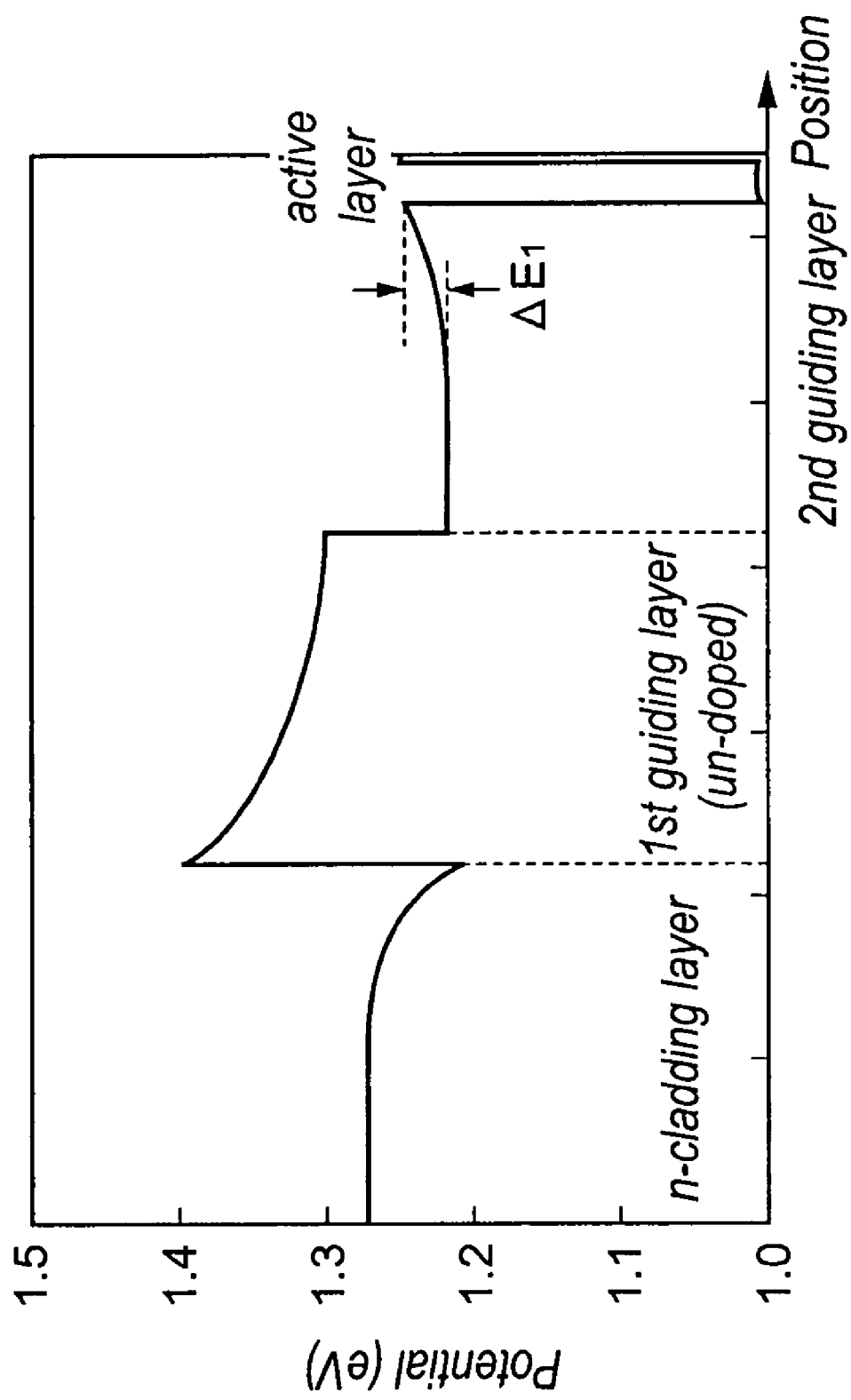
FIG. 2 is a conduction band diagram of the laser diode according to a first embodiment of the invention.
Figure 3:
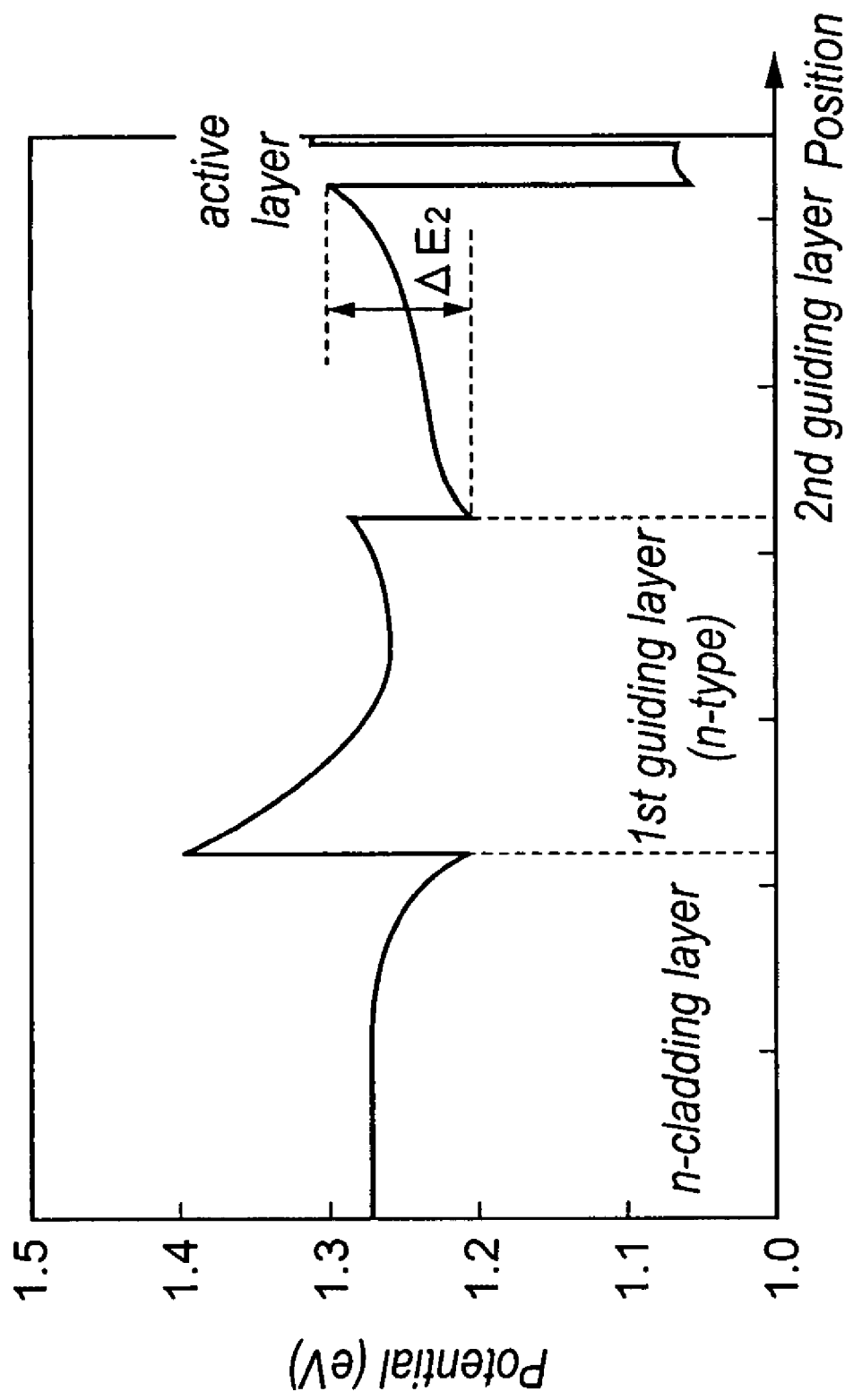
FIG. 3 is a conduction band diagram of a conventional laser diode with guiding layers doped.

FIGS. 2 and 3 are conduction band diagrams for the LD configured in Table I and II, respectively. The vertical axes of these figures have a unit of the electron-volt [eV].

In addition to the barrier by the first guiding layer 17, the band diagram of the conduction band in FIG. 3 for the conventional configuration shown in Table II appears a bad bending of ΔE2 in the second guiding layer 19. The reason why the band bending is caused is that: because the first guiding layer 17 has a higher conduction level compared to the neighbor layers, 15 and 19, the flow out of the electrons occurs to deplete regions adjacent to the neighbor layers, which ionizes the donor impurities doped therein. In the second guiding layer 19, the electrons are accumulated in the interface region with the first guiding layer, which forms the band bending $\Delta E2$ therein about 100 meV. This band bending may block the carrier injection into the active layer 13 and thus raises the series resistance of the device.

In the embodiment configured in Table I, whose band diagram is illustrated in FIG. 2, although the flow out of the electrons from the first guiding layer 17 to the neighbor layers, 15 and 19, also occurs, the ionization of impurities may not occur because the first guiding layer 17 is un-doped, which suppresses the band bending $\Delta E1$ in the second guiding layer 19 to 30 meV at most and equivalently decreases the series resistance of the device by 3 $\Omega$.

When the first guiding layer is made of GaInAsP, which is generally applied to a conventional LD, the bottom of the conduction band in the GaInAsP first guiding layer is lower than that of the n-cladding layer 15. Accordingly, the flow out of carriers in the first guiding layer 17 to the n-type cladding layer 19 may not occur, and even the carries in the first guiding layer 17 flows out the second guiding layer 19, the carriers from the n-type cladding layer may compensate the carries flowed out, thus, which causes no band-bending in the first guiding layer 17.

The LD 11 provides the n-type cladding layer made of InP and the first guiding layer 17 of AlGaInAs whose band gap wavelength is longer than 1.1 μm. For the second guiding layer of the LD 11, AlGaInAs is also applicable, or GaIriAsP may be also applied which is popular material in the InP based devices. When the second guiding layer applies GaInAsP, the device may enhance the reliability because this layer does not contain aluminum (Al), which is easily oxidized.

Second Embodiment

Figure 4:
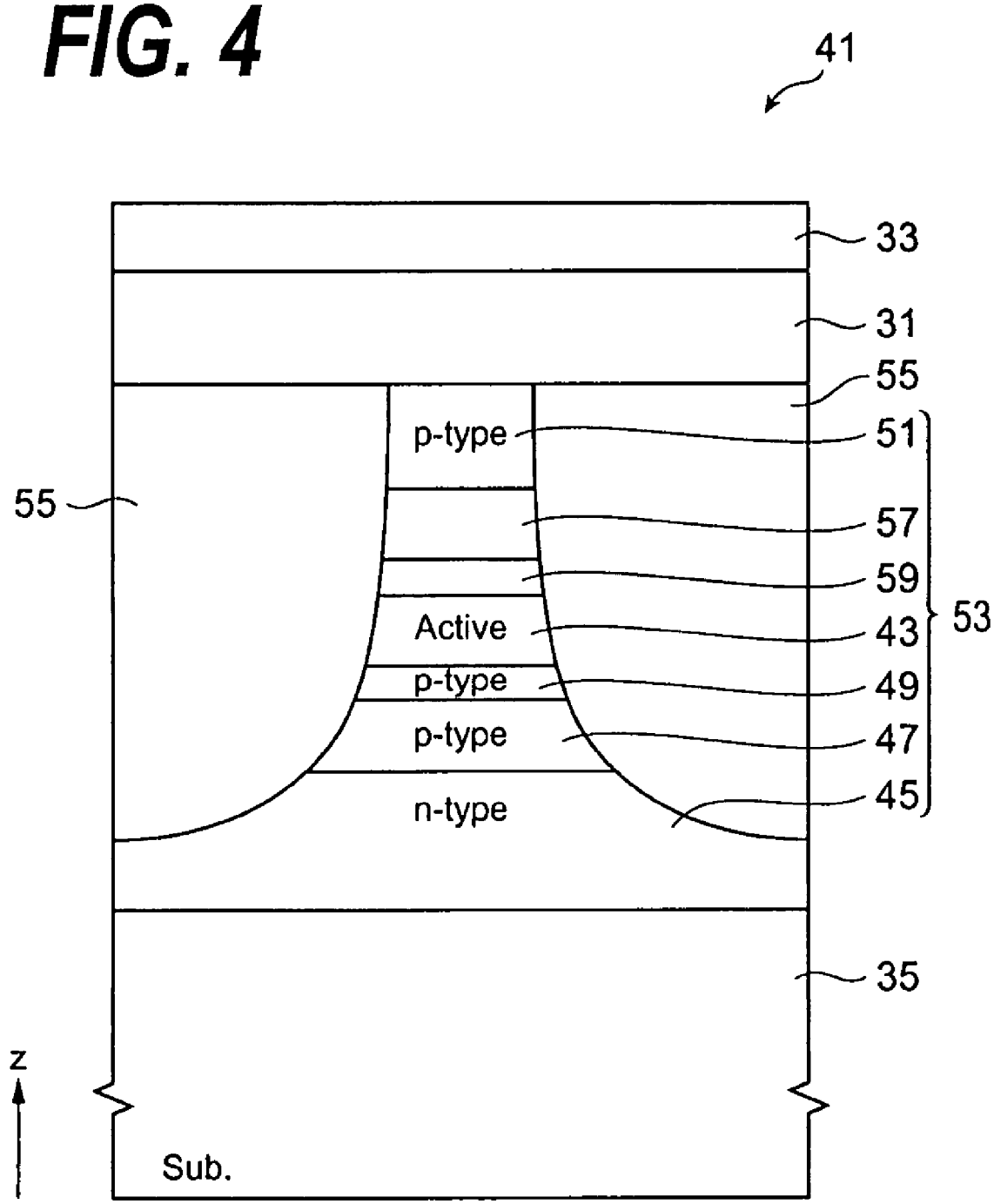
FIG. 4 is a cross section of another laser diode according to a second embodiment of the invention.
Figure 5:
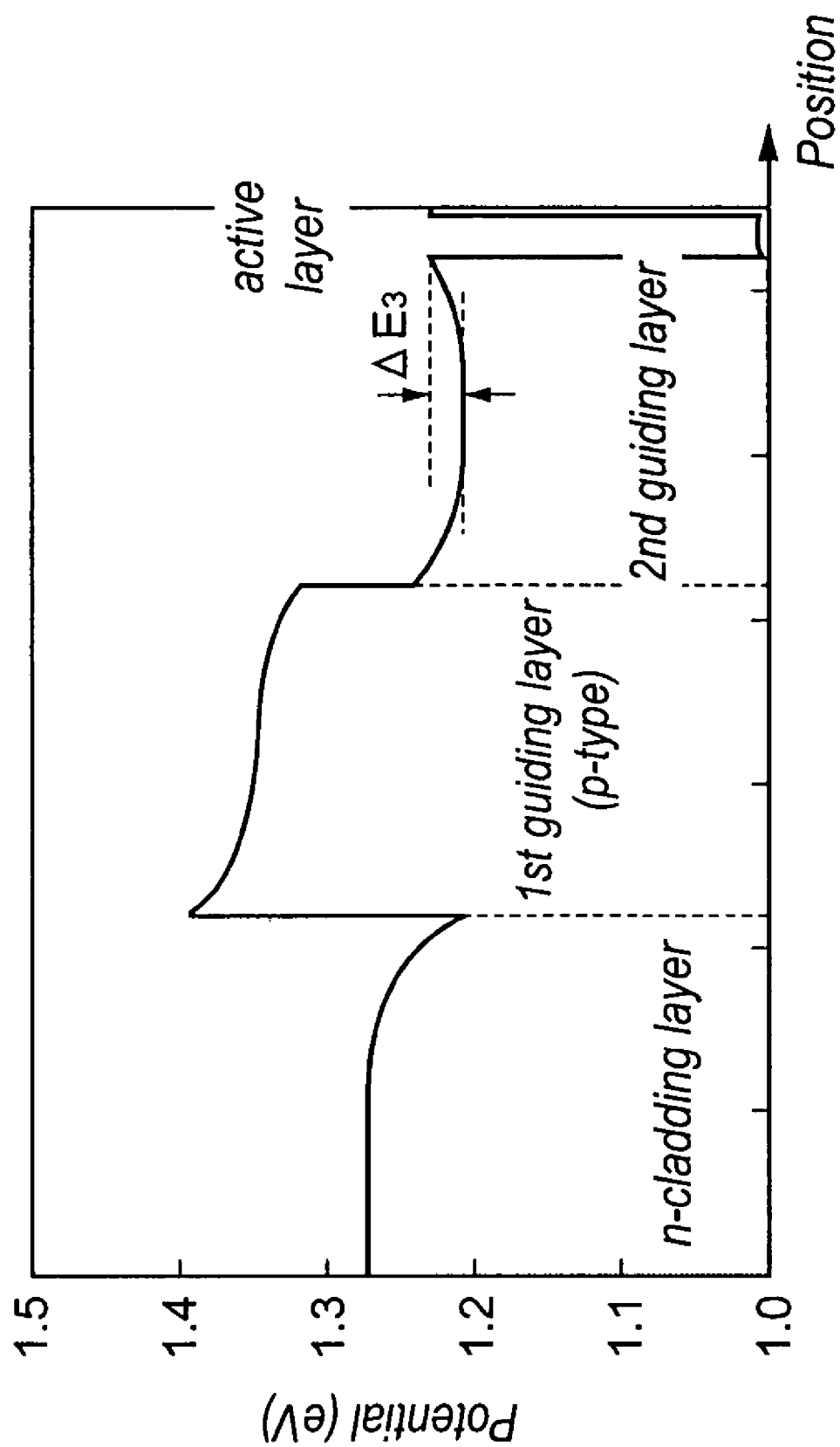
FIG. 5 is a conduction band diagram of the laser diode of the second embodiment.

FIG. 4 is a cross section of another LD according to the second embodiment of the invention. The LD 41 includes the active layer 43, the n-type cladding layer 45 made of the first group III-V compound semiconductor material, and the first and second guiding layers, 47 and 49. The first guiding layer 47, put between the n-type cladding layer 45 and the active layer 43, may be made of the second group III-V compound semiconductor material, while the second guiding layer 49, put between the first guiding layer 47 and the active layer 43, may be made of the third group III-V compound semiconductor material. In the present embodiment, the first guiding layer 47 shows a p-type characteristic. The energy level of the conduction band in the second guiding layer 49 is lower than that of the first guiding layer 47. The band gap wavelength of the second group III-V compound semiconductor material, which is for the first guiding layer 47, is shorter than that of the third group III-V compound semiconductor material for the second guiding layer 49.

The LD shown in FIG. 4 includes the p-type first guiding layer 47, accordingly, even when the electron oozes out the n-type cladding layer 45, it does not leave the donors positively charged within the first guiding layer 47, which reduces potential barrier caused in the second guiding layer 49 to be small. When the second guiding layer 49 is doped in a p-type, the potential barrier formed therein may be further small.

The configuration of the active layer 43 is preferable to those described in connection with the first embodiment but not restricted thereto.

The LD 41 may further include, in addition to the n-type cladding layer 45, a p-type cladding layer 51. These cladding layers, 45 and 51, has a function to confine light generated in the active layer 43 in a region between these cladding layers, 45 and 51. The band gap energy of these cladding layers, 45 and 51, is greater than that of the active layer 43.

The LD 41 may further include one or more guiding layers between the active layer 43 and the p-type cladding layer 51. The second embodiment shown in FIG. 4 includes third and fourth guiding layers, 57 and 59. The third guiding layer 57 is, put between the active layer 43 and the p-type cladding layer 51, made of a fourth group III-V compound semiconductor material, while, the fourth guiding layer 59, put between the third guiding layer 57 and the active layer 43, is made of the fifth group III-V compound semiconductor material. The band gap wavelength of the third guiding layer 57, which corresponds to the fourth material, is greater than that of the fourth guiding layer 59 corresponding to the fifth material.

Moreover, the level of the conduction band in the fourth guiding layer 59, namely, the fifth semiconductor material, is lower than that of the third guiding layer, namely, the fourth semiconductor material. Similar to the first embodiment shown in FIG. 1, the layers from the first guiding layer 47 to the p-type cladding layer 51 and a portion of the n-type cladding layer 45 form a mesa structure 53, and the LD 41 may further include the current blocking region 55 in both sides of the mesa structure 53 to concentrate carriers, electrons and holes, into the mesa structure 53.

The thickness of first guiding layer 47 is preferably greater than 30 nm, while that of the second guiding layer 49 may be greater than a thickness of the barrier layer in the multiple quantum well structure in the active layer 43, which is 8 nm in the present embodiment. Further, a second guiding layer 49 with a thickness grater than 20 nm may enhance the optical confinement efficiency, which enables the LD 41 to be operable in higher temperatures.

The doping concentration of the first guiding layer 47 may be greater than $1\times10^{17}$ cm$^{-3}$, which reduces the resistivity of the first guiding layer 47 enough, while, the first guiding layer 47 is preferable to be doped with $1\times10^{18}$ cm$^{-3}$ at most, which suppress the free electron absorption and accordingly, the degradation of the optical output power of the LD 41.

For the second guiding layer 49, the doping concentration thereof is preferable to be greater than $1\times10^{16}$ cm$^{-3}$, which considerably lowers the potential barrier within the layer 49, and is preferable to be smaller than $1\times10^{18}$ cm$^{-3}$, which suppresses the optical absorption by the free electrons, accordingly, suppresses the degradation of the optical output power.

The following table II shows an exemplary configuration of the LD 41 in the first and second guiding layers thereof according to the second embodiment of the invention:

TABLE III

Configuration of first and second guiding layers of the LD according to the second embodiment

| | | |
|---|---|---|
| first guiding layer 47 | p-type AlGaInAs | $\Lambda$(Eg): 0.92 μm<br>[p]: $1 \times 10^{17}$ cm$^{-3}$<br>t: 40 nm |
| second guiding layer 49 | p-type AlGaInAs | $\Lambda$(Eg): 1.0 μm<br>[p]: $1 \times 10^{17}$ cm$^{-3}$<br>t: 32 nm |

Because the first guiding layer 47 of the present embodiment dopes p-type dopants, the band bending of the conduction band of this first guiding layer may be further suppressed compared to that in the first embodiment shown in FIG. 1. The barrier potential ΔE3 within the second guiding layer 49 of this configuration is about 20 meV, which is further smaller than that of the first embodiment. The differential resistance of the LD 41 reduces at least 3 Ω, which is equal to the case for the first embodiment. The p-type guiding layer 47 is superior in a point compared to the intrinsic guiding layer of the first embodiment that the carrier concentration of the guiding layer is easily controlled to a specific value.

The LD 41 provides the n-type cladding layer 45 made of InP and the first guiding layer 47 made of AlGaInAs quaternary compound whose composition corresponds to the band gap wavelength shorter than 1.1 μm. However, the LD 41 may use GaInAsP quaternary compound for the second guiding layer 49, which enhances the reliability of the LD 41 because the second guiding layer does not contain aluminum (Al).

Thus, the invention is described as referring to embodiments. However the present invention is not restricted to those embodiments, and is well understood by a person with ordinary skill in the field. For example, although the embodiments concentrate only on the n-type InP substrate, the LD according to the present invention may include a p-type substrate. Accordingly, various modifications, adaptations, and combinations of various features of the described embodiments may be practiced without departing from the scope of the invention as set forth in the appended claims.

I claim:

1. A semiconductor laser diode, comprising:
   an active layer;
   an n-type cladding layer made of a first group III-V compound semiconductor material;
   a first guiding layer provided between the active layer and the n-type cladding layer, the first guiding layer being made of AlGaInAs with a first band gap wavelength and a first conduction band level; and
   a second guiding layer provided between the first guiding layer and the active layer, the second guiding layer being made of a second group III-V compound semiconductor material with a second band gap wavelength and a second conduction band level lower than the first conduction band level in the first guiding layer, the first band gap wavelength of the first guiding layer being shorter than the second band gap wavelength,
   wherein the first guiding layer is a p-type layer.

2. The semiconductor laser diode according to claim 1, wherein the first guiding layer has a hole concentration greater than $1\times10^{16}$ cm$^{-3}$.

3. The semiconductor laser diode according to claim 1, wherein the first guiding layer has a hole concentration smaller than $1\times10^{18}$ cm$^{-3}$.

4. The semiconductor laser diode according to claim 1, wherein the second guiding layer is a p-type layer.

5. The semiconductor laser diode according to claim 4, wherein the second group III-V compound semiconductor material has a hole concentration greater than $1\times10^{16}$ cm$^{-3}$.

6. The semiconductor laser diode according to claim 4, wherein the second group III-V compound semiconductor material has a hole concentration smaller than $1\times10^{18}$ cm$^{-3}$.

7. The semiconductor laser diode according to claim 1, wherein the second III-V compound semiconductor material is selected from a group of AlGaInAs and GaInAsP, and
wherein the first group III-V compound semiconductor material is n-type InP.

8. The semiconductor laser diode according to claim 1, wherein the first guiding layer has a thickness greater than 30 nm.

9. The semiconductor laser diode according to claim 1, wherein the active layer has a multiple quantum well structure with a plurality of barrier layers and a plurality of well layers, and
wherein the second guiding layer has a thickness greater than a thickness of the barrier layer.

10. The semiconductor laser diode according to claim 9, wherein the second guiding layer has a thickness greater than 20 nm.

* * * * *